(12) United States Patent
Natsuhara et al.

(10) Patent No.: US 7,361,230 B2
(45) Date of Patent: Apr. 22, 2008

(54) SUBSTRATE PROCESSING APPARATUS (75) Inventors: Masuhiro Natsuhara, Itami (JP); Hirohiko Nakata, Itami (JP); Akira Kuibira, Itami (JP); Kenji Shinma, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 10/119,955

(22) Filed: Apr. 9, 2002

(65) Prior Publication Data
US 2003/0029569 A1 Feb. 13, 2003

(30) Foreign Application Priority Data
Apr. 11, 2001 (JP) ............................. 2001-112902

(51) Int. Cl.
H01L 21/00 (2006.01)
C23C 16/00 (2006.01)

(52) U.S. Cl. .................. 118/728; 118/724; 118/725; 118/500; 219/444.1; 361/234; 279/128; 156/345.51; 156/345.52; 156/345.53

(58) Field of Classification Search ............... 118/724, 118/725, 500, 728; 219/444.1, 544; 361/234; 156/345.51, 345.52, 345.53; 279/128
See application file for complete search history.

(56) References Cited

U.S. PATENT DOCUMENTS

| 4,771,730 | A | * | 9/1988 | Tezuka ................... 118/723 E |
|---|---|---|---|---|
| 5,231,690 | A | * | 7/1993 | Soma et al. ................ 392/416 |
| 5,240,505 | A | * | 8/1993 | Iwasaki et al. ............. 118/719 |
| 5,306,895 | A | | 4/1994 | Ushikoshi et al. |
| 5,462,603 | A | * | 10/1995 | Murakami ................... 118/719 |
| 5,490,228 | A | | 2/1996 | Soma et al. |
| 5,581,874 | A | * | 12/1996 | Aoki et al. ..................... 29/825 |
| 5,665,166 | A | * | 9/1997 | Deguchi et al. .......... 118/723 E |
| 5,709,757 | A | * | 1/1998 | Hatano et al. ............ 134/22.14 |
| 5,751,537 | A | * | 5/1998 | Kumar et al. ................ 361/234 |
| 5,823,416 | A | * | 10/1998 | Haji ............................ 228/4.5 |
| 5,851,298 | A | * | 12/1998 | Ishii ............................ 118/728 |
| 6,080,970 | A | * | 6/2000 | Yoshida et al. ........... 219/444.1 |
| 6,201,219 | B1 | * | 3/2001 | Sandhu et al. .............. 219/390 |
| 6,204,489 | B1 | * | 3/2001 | Katsuda et al. ............. 219/544 |
| 6,228,173 | B1 | * | 5/2001 | Okase et al. ................. 118/719 |
| 6,273,957 | B1 | * | 8/2001 | Yamamuka et al. ......... 118/724 |
| 6,294,771 | B2 | | 9/2001 | Katsuda et al. |
| 6,299,691 | B1 | | 10/2001 | Oda et al. |
| 6,440,221 | B2 | * | 8/2002 | Shamouilian et al. ....... 118/724 |

(Continued)

FOREIGN PATENT DOCUMENTS

EP 0 447 155 9/1991

(Continued)

*Primary Examiner*—Ram N. Kackar
(74) *Attorney, Agent, or Firm*—W. F. Fasse; W. G. Fasse (57) ABSTRACT

In the substrate processing apparatus, a ceramic module for mounting a substrate has a flat plate portion having an electric circuitry and a ceramic base body, and as at least a part of a surface of the flat plate portion other than the surface mounting the substrate is in contact with a chamber, it is supported by the chamber. Thus, a substrate processing apparatus can be provided which improves thermal uniformity, reduces cost, is suitable for size reduction of the apparatus and which can ease restrictions in mounting a power supply conductive member or the like.

23 Claims, 7 Drawing Sheets

U.S. PATENT DOCUMENTS

| | | | |
|---|---|---|---|
| 6,524,731 B1* | 2/2003 | Araki | 428/696 |
| 6,554,906 B1* | 4/2003 | Kuibira et al. | 118/725 |
| 2001/0014111 A1* | 8/2001 | Shimizu | 374/126 |

FOREIGN PATENT DOCUMENTS

| | | |
|---|---|---|
| EP | 0 506 391 | 9/1992 |
| JP | 03-261131 | 11/1991 |
| JP | 04 078138 | 3/1992 |
| JP | 05-009740 | 1/1993 |
| JP | 07-36391 | 4/1995 |

* cited by examiner

SUBSTRATE PROCESSING APPARATUS

BACKGROUND OF THE INVENTION

1. Field of the Invention

The present invention relates to a substrate processing apparatus used for processing such as plasma CVD (Chemical Vapor Deposition), low pressure CVD, metal CVD, insulating film CVD, ion implantation and etching.

2. Description of the Background Art

For semiconductor manufacturing apparatuses for processing semiconductor substrates such as silicon wafers as one type of the substrate processing apparatus, various susceptors (ceramics module) for mounting and heating a wafer have been proposed, some of which have been already practically used.

Figure 8:
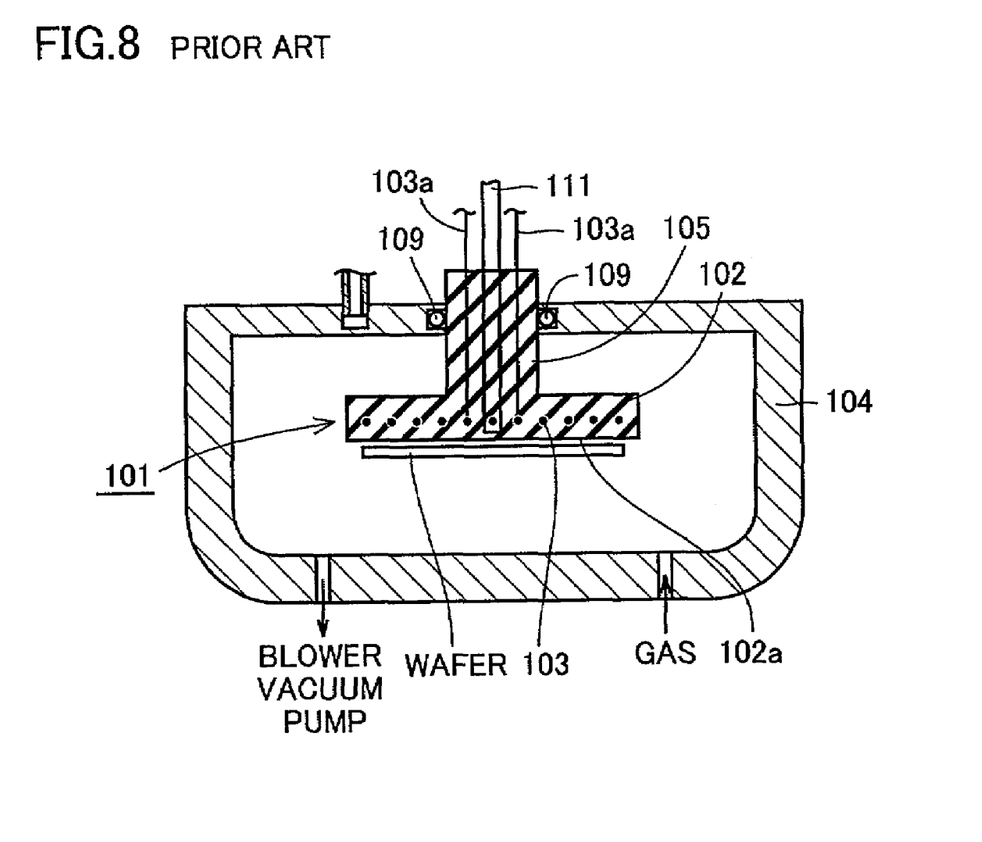
FIG. 8 is a cross section schematically showing a structure of a semiconductor wafer heating apparatus disclosed in Japanese Patent Laying-Open No. 4-78138.

For example, Japanese Patent Laying-Open No. 4-78138 proposes a semiconductor wafer heating apparatus such as shown in FIG. 8.

Referring to FIG. 8, a semiconductor wafer heating apparatus 101 has a T-shaped cross section, and in which a disk-shaped heater portion 102 and a columnar support portion 105 are integrated. Disk-shaped heater portion 102 is formed of ceramic, and a resistance heater 103 is embedded spirally therein.

Columnar support portion 105 is joined to a center of portion on the rear surface of a wafer heating surface 102a. An O-ring 109 is provided between an outer circumferential surface of columnar support portion 105 and a chamber 104 for air tight sealing. A thermocouple 111 and two electrodes 103a are embedded in disk-shaped heater portion 102 and columnar support portion 105, and taken out from chamber 104 through an upper end surface of columnar support portion 105.

In such heating apparatus 101, when power is supplied to an end portion of resistance heater 103 through electrode 103a, resistance heater 103 generates heat, and wafer heating surface 102a is heated.

According to this publication, heating apparatus 101 can prevent contamination as experienced by a metal heater, does not suffer from unsatisfactory thermal efficiency as in an indirect heating method, and does not suffer from the problem of thermal adhesion onto an infrared transmission window. Further, in the heating apparatus, corrosion of electrodes as well as discharge and leakage between electrodes or the electrode housing can also be prevented.

However, in heating apparatus 101 having the above described structure, it is necessary to attach columnar support portion 105 to disk-shaped heater portion 102 in which resistance heater 103 is embedded. This results in a complicated structure and hence significantly increases cost. Further, as columnar support portion 105 supports disk-shaped heater portion 102, it must have a large cross sectional area and large thermal capacity. Thus, as the heat generated by resistance heater 103 is transferred to columnar support portion 105, thermal uniformity of wafer heating surface 102a of disk-shaped heater portion 102 is made unstable.

Further, in order to attain air tight seal using O-ring 109 at the contact portion between columnar support portion 105 and chamber 104, it is necessary to lower the temperature to be 200° C. or lower. Thus, the length of columnar support portion 105 becomes 200 mm or longer, and the height of the apparatus cannot be made smaller.

Further, in order to support disk-shaped heater 102, in most cases the columnar support portion 105 is attached to the central portion on the rear surface of disk-shaped heater portion 102. This poses restrictions on the position of mounting power supply conductive members or thermocouple electrically connected to resistance heater 103.

SUMMARY OF THE INVENTION

An object of the present invention is to provide a substrate processing apparatus that realizes satisfactory thermal uniformity, reduces cost, is suitable for reduction in size of the apparatus and eases restrictions in mounting the power supply conductive members and the like.

The present invention provides a substrate processing apparatus processing a substrate mounted on a substrate susceptor in a chamber, in which the susceptor has a flat plate portion having an electric circuitry and a ceramic base body, and supported by the chamber as at least a surface of the flat plate portion other than the surface on which the substrate is mounted is in contact with the chamber.

In the substrate processing apparatus of the present invention, as the flat plate portion of the ceramic base body is directly in contact with the chamber, it becomes unnecessary to provide the columnar support body as in the prior art on the ceramic base body itself. Namely, the ceramic base body can be directly placed in the chamber. Thus, the structure of the ceramic base body itself can significantly be simplified.

The inventors repeated design and experiment to confirm whether such a structure is feasible as a manufacturing apparatus, and found that substrate processing is possible even under reduced pressure lower than 1 atmospheric pressure, from the following reasons.

In the substrate processing apparatus of the present invention, when viewed macroscopically, the ceramic base body and the chamber are simply in point contact, with the contact area being extremely small. Thus, the quantity of heat transmitted from the ceramic base body to the chamber by thermal transfer is relatively small. Further, the atmosphere in the chamber is generally under low pressure, that is, 1 atmospheric pressure or lower. Thus, the quantity of heat transmitted from the ceramic base body to the chamber by convection is also small. Further, the chamber is generally formed of metal, and therefore it has lower emissivity than the ceramic base body.

Therefore, even when the heat generated by the ceramic base body is radiated to the chamber, most of the heat is reflected by the chamber and absorbed again by the ceramic base body. Thus, the quantity of heat transmitted from the ceramic base body to the chamber is relatively small.

As described above, the quantity of heat transmitted from the ceramic base body to the chamber through thermal transfer, convection and radiation is relatively small, and thermal transfer density becomes uniform dependent on the possibility of contact. Therefore, it is not the case that a local portion on the ceramic base body transfers heat in a concentrated manner to the chamber. Thus, influence to the thermal uniformity of the substrate mounting surface is small. Thus, a substrate processing apparatus having superior thermal uniformity of the substrate mounting surface can be provided.

Further, the conventional columnar support portion becomes unnecessary. Therefore, the cost can significantly be reduced, and the restrictions in attaching the power supply conductive members and the like can be eased.

Further, different from the prior art, the columnar support portion having the length of 200 mm or more does not exist. Therefore, the chamber itself can be reduced in size. Further, as the chamber can be made smaller, the substrate processing apparatus itself can be made smaller.

As to the method of fixing the flat plate portion on the chamber, a recessed portion slightly larger than an outer shape of the flat plate portion may be formed at a portion of the chamber where the flat plate portion is to be placed, and the flat plate portion may simply be fitted therein. Thus, without the necessity of forming a protruded portion on the flat plate portion, it is possible to mount the substrate on the substrate mounting surface and to perform various CVD, etching and other processes under reduced pressure of lower than 1 atmospheric pressure.

In the present invention, "substrate processing apparatus" includes a semiconductor manufacturing apparatus and a liquid crystal substrate manufacturing apparatus, and "substrate" includes a semiconductor wafer and a transparent substrate (glass substrate) for liquid crystal.

In the above described substrate processing apparatus, preferably, the electric circuitry includes at least one selected from the group consisting of a resistance heater, an electrode for electrostatic chuck and an RF (Radio Frequency) electrode.

As the resistance heater, the electrode for electrostatic chuck and the RF electrode are used each by itself or in various combinations as the electric circuitry, processing of the substrate in accordance with various different conditions becomes possible. How to combine the resistance heater, the electrode for electrostatic chuck and the RF electrode may appropriately be selected dependent on the processing condition.

Here, the electrode for electrostatic chuck and the RF electrode do not directly generate heat, unlike the resistance heater. However, heat is build up in the electrostatic chuck at the time of etching, for example, and in the RF electrode at the time of plasma generation. Thus, temperature distribution thereof has an influence on the processing of the wafer or the liquid crystal substrate. In the substrate processing apparatus of the present invention, however, the ceramic base body is in direct contact with the chamber as described above. Therefore, temperature distribution generated at the electrode for electrostatic chuck and the RF electrode is very uniform as compared with the conventional structure.

Preferably, in the substrate processing apparatus described above, there is a small space between the flat plate portion and the chamber which are in contact with each other.

As a small space exist between the flat plate portion and the chamber that are in contact with each other, the flat plat portion and the chamber are in point contact when viewed macroscopically, and the contact area is very small. Thus, the quantity of heat transmitted from the flat plate portion to the chamber by thermal transfer is relatively small, as already described.

Preferably, the substrate processing apparatus further includes a power supply conductive member electrically connected to the electric circuitry and drawn out from the chamber, and a temperature measurement terminal inserted from the outside to the inside of the chamber for measuring temperature of the ceramic base body. The portion at which the power supply conductive member and the temperature measuring terminal pass through the chamber is air-tightly sealed on the chamber side.

In the structure of the present invention, the electric circuitry such as the resistance heater, the electrode for electrostatic chuck and the RF electrode is formed on the ceramic base body, and therefore, it is necessary to draw out a power supply conductive member to the outside of the chamber. Further, even when a thermocouple is used as a temperature measurement sensor for measuring the temperature of the ceramic base body itself, it is necessary to draw out the lead portion of the thermocouple to the outside of the chamber, as in the case of the power supply conductive member. In order to process the wafer or the liquid crystal substrate in a reduced pressure of lower than 1 atmospheric pressure in the chamber, air-tightness of the chamber must be ensured. As a method of ensuring air-tightness, it is necessary to realize air-tight sealing between the power supply terminal or the thermocouple drawn out from the ceramic base body and the chamber. An O-ring formed of resin or rubber, may be used as means for ensuring air-tight sealing.

In the present invention, "air-tight sealing on the chamber side" refers to air-tight sealing established between the chamber and a member other than the ceramic base body.

Preferably, in the substrate processing apparatus, the power supply conductive member is covered by a first coating member of the same material as the ceramic base body, at least in the chamber.

As the power supply conductive member is covered by the same coating member as the ceramic base body, corrosion of each power supply conductive member caused by the influence of gas or plasma used in the chamber can be prevented. The coating member may be joined to the ceramic base body to maintain air-tightness with respect to the chamber, and it may establish air-tightness with the outside when the coating member is extended to the air-tight sealing portion between the chamber and outside, for example, to the O-ring attached to the chamber.

There is no limitation as to the method of joining the ceramic base body and the coating member. Known methods may be used as the method of joining. For example, it nay be joined by using a metal brazing material containing an active metal such as titanium. Alternatively, a metal film may be formed by a thin film method such as vapor deposition or a metallization layer may be formed by a thick film method such as screen printing, on the ceramic base body or on the coating member, plating may be performed as needed, and the joining may be established by brazing material. Alternatively, glass or ceramic may be used as a joining layer. Such joining layer may appropriately be selected dependent on the condition of use.

Preferably, in the above described substrate processing apparatus, the temperature measurement terminal is covered by a second coating member which is the same as the material of the ceramic base body, at least in the chamber.

When the temperature measurement sensor is a thermocouple, for example, the thermocouple is arranged close to the ceramic base body to measure the temperature of the ceramic base body. Here, when the thermocouple is covered with a coating member of the same material as the ceramic base body, corrosion of the terminal caused by the influence of gas or plasma used in the chamber can be prevented.

Further, when the coating member is extended to the air-tight sealing portion between the chamber and the outside, for example to the O-ring attached to the chamber, air-tightness with the outside can be ensured. Further, it is possible to join the ceramic base body and the coating member. There is no restriction as to the method of joining and a known method may be used. For example, it may be joined by using a metal brazing material containing an active metal such as titanium. Alternatively, a metal film may be formed by a thin film method such as vapor deposition or a matallization layer may be formed by a thick film method such as screen printing, on the ceramic base body or on the coating member, plating may be performed as needed, and the joining may be established by brazing material. Alternatively, glass or ceramic may be used as a joining layer. Such joining layer may appropriately be selected dependent on the condition of use.

When the power supply conductive member and the temperature measurement sensor are covered by the coating members of the same material as the ceramic, it is possible to provide a plurality of power supply conductive members and a plurality of temperature measurement sensors in the coating member. This enables reduction in number of the coating member.

Further, the coating member serves to protect the power supply conductive member and the temperature measurement sensor from the chamber atmosphere as described above, and it does not serve to support the ceramic base body onto the chamber. Thus, the size of the coating member can significantly be made smaller than the size of the conventional columnar support portion. Thus, the joint.contact area between the coating member and a ceramic base body can also be made smaller, and thermal capacity of the coating member itself can be made smaller. Thus, quantity of heat transmitted to the coating member becomes smaller, and hence thermal uniformity of the substrate mounting surface of the ceramic base body is not so much degraded as in the prior art.

Further, as the coating member does not support the ceramic base body on the chamber, the cross sectional area of the member can be made small. Thus, there is no restriction as to the mounting position. Conventionally, one central portion of the disk-shaped heater portion must have a holding function and the columnar support portion must be attached thereon. By contrast, in the present invention, it is possible to attach the coating members at a plurality of positions other than the substrate mounting surface of the ceramic base body. Thus, electrode position can be selected freely in designing the electric circuitry. Further, the temperature measurement sensor can also be freely attached to the surface other than the substrate mounting surface of the ceramic base body. Therefore, temperatures of any number of portions may be measured as needed. Thus, the temperature of the ceramic base body can be monitored and controlled with higher accuracy.

Preferably, the above described substrate processing apparatus further includes a power supply conductive member electrically connected to the electric circuitry and drawn out from the chamber, and a temperature measurement terminal inserted from the outside to the inside of the chamber for measuring temperature of the ceramic base body. The portion at which the power supply conductive member and the temperature measurement terminal pass through the chamber is air-tightly sealed as the flat plate portion and chamber are joined.

As the flat plate portion is partially joined to the chamber, air-tightness of the temperature measurement sensor and the power supply terminal can he maintained. There is no specific restriction as to the method of joining the chamber and the fist plate portion. For example, a brazing material containing active metal such as silver, copper, gold, platinum, palledium, nickel, aluminum, titanium, or niobium may be used. As to the method of using the brazing material, direct joining by a metal brazing member containing an active metal such as titanium is possible, for example. Further, a metal may be vapor-deposited by the thin film method at that portion of the ceramic which is to be sealed, and the brazing material may be caused to flow thereto, to attain form the joint. Further, the chamber and the flat plate portion may be joined by glass. Dependent on the processing of the semiconductor or the liquid crystal substrate, some of the materials including the above described brazing materials, vapor-deposited films end glees may not be used. Therefore, it is necessary to select an appropriate material in accordance with the use.

Preferably, in the above described substrate processing apparatus, at least a part of a surface of the chamber that is in contact with the flat plate portion is a mirror finished surface.

As described above, the heat generated by the ceramic base body is transmitted to the chamber through radiation, heat transfer and convection. Here, when the chamber side has a mirror-finished surface, the heat radiated from the ceramic base body would be reflected by the chamber at a higher ratio, so that the quantity of heat transmitted to the chamber is significantly reduced, which is very much effective in suppressing temperature increase.

Preferably, in the above described substrate processing apparatus, at least a surface other than the substrate mounting surface of the substrate susceptor is a mirror-finished surface.

When the heat generated in the ceramic base body is radiated to the outside of the ceramic base body and the surface of the substrate susceptor is mirror-finished, the heat would be reflected at the surface with higher ratio, and the ratio of thermal radiation to the outside of the substrate susceptor decreases. Thus, temperature increase of the chamber can be suppressed. The surface for mounting the wafer and the liquid crystal substrate, however, need not be mirror-finished, as it is necessary to heat the wafer and the liquid crystal substrate.

Preferably, in the substrate processing apparatus, surface roughness of at least one of the chamber surface which is in contact with at least the flat plate portion and the at least one surface other than the substrate mounting surface of the substrate susceptor, is Ra≦0.2 μm.

When at least the chamber surface at least in contact with the flat plate portion or at least a part of the surface other than the substrate mounting surface of the substrate susceptor is mirror-finished, temperature increase of the chamber can effectively be suppressed. More specifically, when the surface roughness is Ra≦0.2 μm, temperature increase can more effectively be suppressed. Thus, temperature increase of the chamber can be suppressed, and the quantity of heat generation by the resistance heater formed in the ceramic base body, that is, the output, can be lowered.

Preferably, the substrate processing apparatus further includes a cooling apparatus provided near a portion of the chamber which is in contact with the flat plate portion.

Though the quantity of heat transmitted from the ceramic base body to the chamber is small, the heat is transmitted to some extent to the chamber, through radiation, heat transfer, convection and through the power supply conductive member, the lead of the temperature measurement sensor and the coating member. Failure of air-tightness resulting from thermal degradation of the O-ring formed of rubber or resin maintaining air-tight seal with the outside, can be prevented by the cooling apparatus.

Various methods may be selected for the cooling apparatus, dependent on the degree of temperature increase of the chamber. When the temperature increase is small, a fin may be attached, for example, and when temperature still increases, a fan may be additionally provided to the fin. Further, a liquid-cooling apparatus using a coolant such as water may be attached. Further, such methods may be combined to efficiently cool the chamber.

Further, in order to thermally protect the O-ring formed of resin or rubber ensuring air-tightness between the chamber and the outside, the space between the coating member and the chamber to which the cooling apparatus is attached may be filled with a thermally conductive member. More specifically, a soft metal, for example, indium, may be filled between the coating member and the chamber, on the outer side of the chamber where the O-ring is attached, so that the heat that has been transmitted to the coating member is leaked to the chamber side, and the temperature near the O-ring can be lowered. Thus, the life of the O-ring can be improved, and reliability of air-tightness can be improved. More specifically, even when the resistance heater placed in the ceramic base body operates abnormally, resulting in abnormal heat, thermal destruction of the O-ring and the leakage of atmospheric air into the chamber can be prevented.

Preferably, the substrate processing apparatus further includes a push pin inserted from the outside to the inside of the chamber, for pushing up the substrate mounted on the substrate susceptor from the substrate susceptor. The portion at which the push pin passes through the chamber is air-tightly sealed, between the push pin and the chamber.

Thus, it is possible to use a push pin when the wafer or the liquid crystal substrate is to be removed from the substrate mounting surface of the substrate susceptor. When the push pin is to be taken out from the chamber, it is necessary to air-tightly seal the push pin as well, as the chamber is used under low pressure. Though there is no specific restriction as to the method of sealing here, an O-ring formed of resin or rubber may be used.

Preferably, the substrate processing apparatus described above is used under a low pressure of 133×10 Pa or lower.

Under the low pressure of 133×10 Pa or lower, quantity of heat transmitted by convection from the ceramic to the chamber becomes smaller. Therefore, use under such a low pressure is particularly preferable.

Preferably, the substrate processing apparatus described above is used for any of the processes including chemical vapor deposition using plasma, chemical vapor deposition under low pressure, chemical vapor deposition for forming a metal layer, chemical vapor deposition for forming an insulating film, ion implantation and etching.

As various portions are air-tightly sealed as described above, use under low pressure of 1 atmospheric pressure or lower is possible without any problem. Therefore, the apparatus can preferably be used for chemical vapor deposition using plasma, chemical vapor deposition under low pressure, chemical vapor deposition for forming a metal layer, chemical vapor deposition for forming an insulating film, ion implantation, plasma etching and optical etching.

Preferably, in the substrate processing apparatus, the ceramic base body includes at least one selected from the group consisting of aluminum oxide, aluminum nitride, silicon nitride and silicon carbide.

These ceramic materials generally have heat resistance and relatively high corrosion resistance as they are dense. Thus, a substrate processing apparatus which realizes both satisfactory heat resistance and corrosion resistance can be provided.

Preferably, in the substrate processing apparatus described above, the ceramic base body is of aluminum nitride.

Among the ceramic materials mentioned above, aluminum oxide (alumina) is particularly suitable for plasma etching. As to silicon carbide, a sintered body of silicon carbide of high impurity that is sintered without adding any sintering assistant agent is used.

Among the ceramics mentioned above, alumina has low thermal conductivity, and therefore low thermal shock resistance. Therefore, it is impossible to abruptly increase or decrease temperature during the steps of manufacturing the semiconductor. As to silicon carbide, silicon carbide itself is conductive, and therefore an electric circuit cannot directly be formed thereon. By contrast, aluminum nitride has superior corrosion resistance and relatively high thermal conductivity, and thus superior thermal shock resistance. Thus, abrupt increase and decrease of temperature during the steps of manufacturing the semiconductor substrate becomes possible. Further, when there is provided a resistance heater, variation in temperature of the substrate mounting surface becomes relatively small, enabling stable processing of the substrate.

Preferably, in the substrate processing apparatus, the ceramic base body includes a sintering assistant agent including a rare earth.

When aluminum nitride is used as the material of the ceramic base body, an abrupt increase and decrease of temperature becomes possible and thus a stable substrate processing becomes possible, as described above. Aluminum nitride, however, is generally a sintering retardant substance, and therefore, a sintered body thereof is fabricated by adding an appropriate amount of sintering assisting agent. The sintering assistant agent used at this time is generally a rare-earth element compound, or an alkali earth metal element compound. When an aluminum nitride sintered body prepared by adding alkali earth metal compound is used, the alkali earth metal compound existing between aluminum nitride particles of the sintered body is etched during processing of the substrate with plasma or corrosive gas, so that aluminum nitride particles slip or fall off from the sintered body. It is confirmed that when the slipped aluminum nitride particles contaminate the chamber, substrate properties of the wafer or the liquid crystal substrate are significantly damaged. Thus, from experience, it is considered preferable to use a rare-earth element compound, which is relatively strong against etching, as the sintering assistant agent.

Preferably, in the substrate processing apparatus described above, the rare-earth included in the sintering assistant agent is yttrium, and the content of the sintering assistant agent is at least 0.05 mass % and at most 1.0 mass %.

Among the rare earths mentioned above, yttrium has particularly high corrosion resistance. When the content of the sintering assistant agent including yttrium is smaller than 0.05 mass %, the amount of the sintering assistant agent is too small, so that small pores result in the sintering body, from which etching proceeds. When the content of the sintering assistant agent including yttrium exceeds 1.0%, "aggregation" of the sintering assistant agent is generated at the grain boundary of aluminum nitride particles, from which etching tends to proceed.

There is no specific restriction as to the method of manufacturing the ceramic fabricated in accordance with the present invention. For example, the sintering assistant agent may be added as needed to raw material powder of ceramic, a binder, and an organic solvent may be added and mixed by a ball mill, for example. The resulting slurry may be formed to a sheet by a doctor blade method, and by stacking the sheets, a compact may be formed. Further, it is possible to stack the sheets with an electric circuit formed on any of the sheets by screen printing, for example, of a metal having high melting point such as tungsten, molybdenum, or tantalum. The resulting compact is sintered at a prescribed temperature in a non-oxidizing atmosphere, to provide a ceramic sintered body. The ceramic body may be appropriately processed, that is, it may be cut, polished, or ground, as needed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following with reference to the figures.

Figure 1:
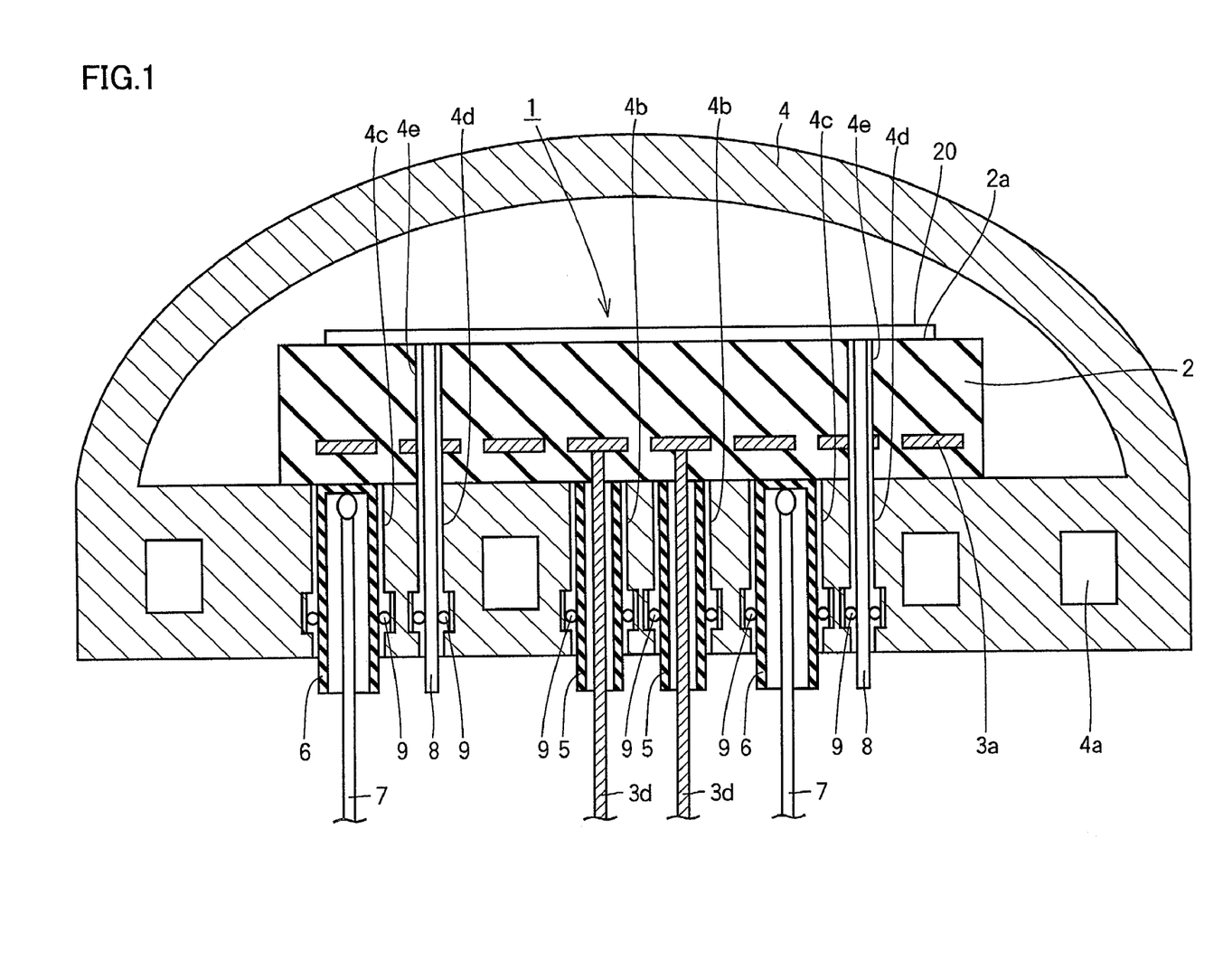
FIG. 1 is a cross section schematically showing a structure of a substrate processing apparatus in accordance with one embodiment of the present invention, which corresponds to the cross section taken along the line I-I of FIG. 2.

Referring to FIG. 1, the substrate processing apparatus in accordance with the present embodiment is for processing a substrate such as a semiconductor wafer or a transparent substrate for liquid crystal. The apparatus mainly includes a ceramic module 1 for mounting and heating the substrate, and a chamber 4 containing the ceramic module 1 therein.

The ceramic module 1 has a flat, plate shape mainly formed of a ceramic base body 2, and an electric circuitry, for example, a resistance heater 3a, is embedded in ceramic base body 2. On a substrate mounting surface 2a of ceramic module 1, a substrate 20 such as a semiconductor wafer or a transparent substrate for liquid crystal is mounted. A surface of ceramic base body 2 opposite to the surface for mounting substrate 20 is in direct contact with a bottom wall of chamber 4 that is entirely formed of a flat planar chamber wall as shown, and thus the ceramic base body 2 is supported by chamber 4.

Though the surface of ceramic base body 2 is shown fully in contact with the chamber 4 in the figure, actually, there are a number of small spaces between ceramic substrate 2 and chamber 4, and therefore, when viewed macroscopically, ceramic base body 2 and chamber 4 are in point contact.

Figure 2:
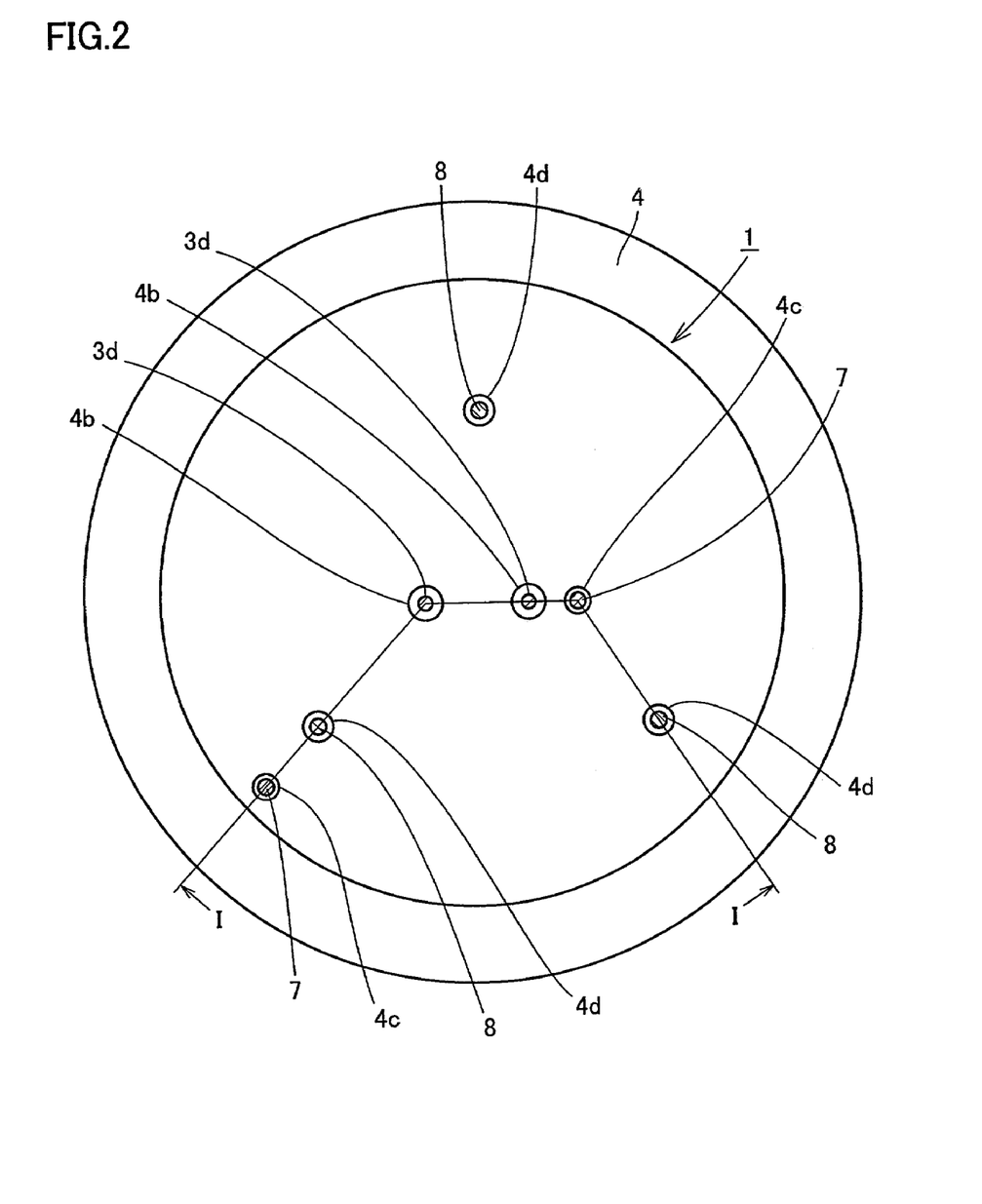
FIG. 2 is a plan view showing a manner of arrangement of through holes in a contact surface between a ceramic module and a chamber.

Referring to FIG. 2, in the contact surface between ceramic module 1 and chamber 4, there are a plurality of through holes 4b, 4c and 4d, passing through chamber 4.

Referring to FIG. 1, through hole 4b is provided for inserting from the outside of chamber 4, a power supply conductive member 3d that is electrically connected to resistance heater 3a. Through hole 4c is provided for inserting, from the outside of chamber 4, a temperature measurement sensor, for example, a thermocouple 7, for measuring temperature of ceramic base body 2, to be close to ceramic base body 2. Through hole 4d is provided for inserting, from the outside of the chamber, a push pin 8 for pushing up the substrate 20 mounted on ceramic module 1. Ceramic module 1 is provided with a through hole 4e though which push pin 8 is passed.

Power supply conductive member 3d electrically connected to resistance heater 3a has its periphery covered by a coating member 5 at least in chamber 4. Thus, corrosion of resistance heater 3a by gas or plasma in chamber 4 is prevented. Coating member 5 is of the same material as ceramic base body 2. An O-ring 9 is provided between outer circumferential surface of coating member 5 and inner circumferential surface of through hole 4b, to attain air-tight sealing.

Thermocouple 7 as the temperature measurement sensor also has its periphery covered by coating member 6 at least in chamber 4, so that corrosion by gas or plasma in chamber 4 is prevented. Coating member 6 is of the same material as ceramic base body 2. An O-ring 9, for example, is provided between outer circumferential surface of coating member 6 and inner circumferential surface of through hole 4c, to attain air-tight sealing.

Each of the through holes 4b and 4c is air-tightly sealed, as ceramic base body 2 is in contact with chamber 4.

An O-ring 9 is provided between the outer circumference of push pin 8 and inner circumference of throughhole 4d, to attain air-tight sealing.

In the vicinity of a portion where ceramic module 1 is arranged of on chamber 4, a liquid cooling apparatus 4a using a coolant such as water is provided. The cooling apparatus 4a is not limited to a liquid cooling apparatus, end it may be a cooling apparatus provided with a fin or a fan, for example.

It is preferred that at least that surface of chamber 4 which is in contact with ceramic base body 2 is mirror-finished. Further, it is preferred that surfaces of ceramic module 1 other than the substrate mounting surface 2a are mirror-finished. Further, the surface of ceramic module 1 which is in contact with chamber 4 is mirror-finished.

Preferably, the surface roughness of the mirror finished portions is Ra≦0.2 μm.

Preferably, the substrate processing apparatus in accordance with the present embodiment is used under a low pressure of 133×10 Pa or lower. Further, the apparatus is preferably used for CVD using plasma, CVD under low pressure, CVD for forming a metal layer, CVD for forming an insulating film, ion implantation or etching. Preferably, the material of ceramic base body 2 is aluminum oxide (alumina), aluminum nitride, silicon nitride, silicon carbide, or an arbitrary combination of these. More preferably, the material is aluminum nitride. When the material of ceramic base body 2 is aluminum nitride, it is preferred that ceramic base body 2 includes sintering assistant agent including a rare earth. Preferably, the rare-earth included in the sintering assistant agent is yttrium. The content of the sintering assistant agent is preferably at least 0.05 mass % and at most 1.0 mass %.

Figure 3:
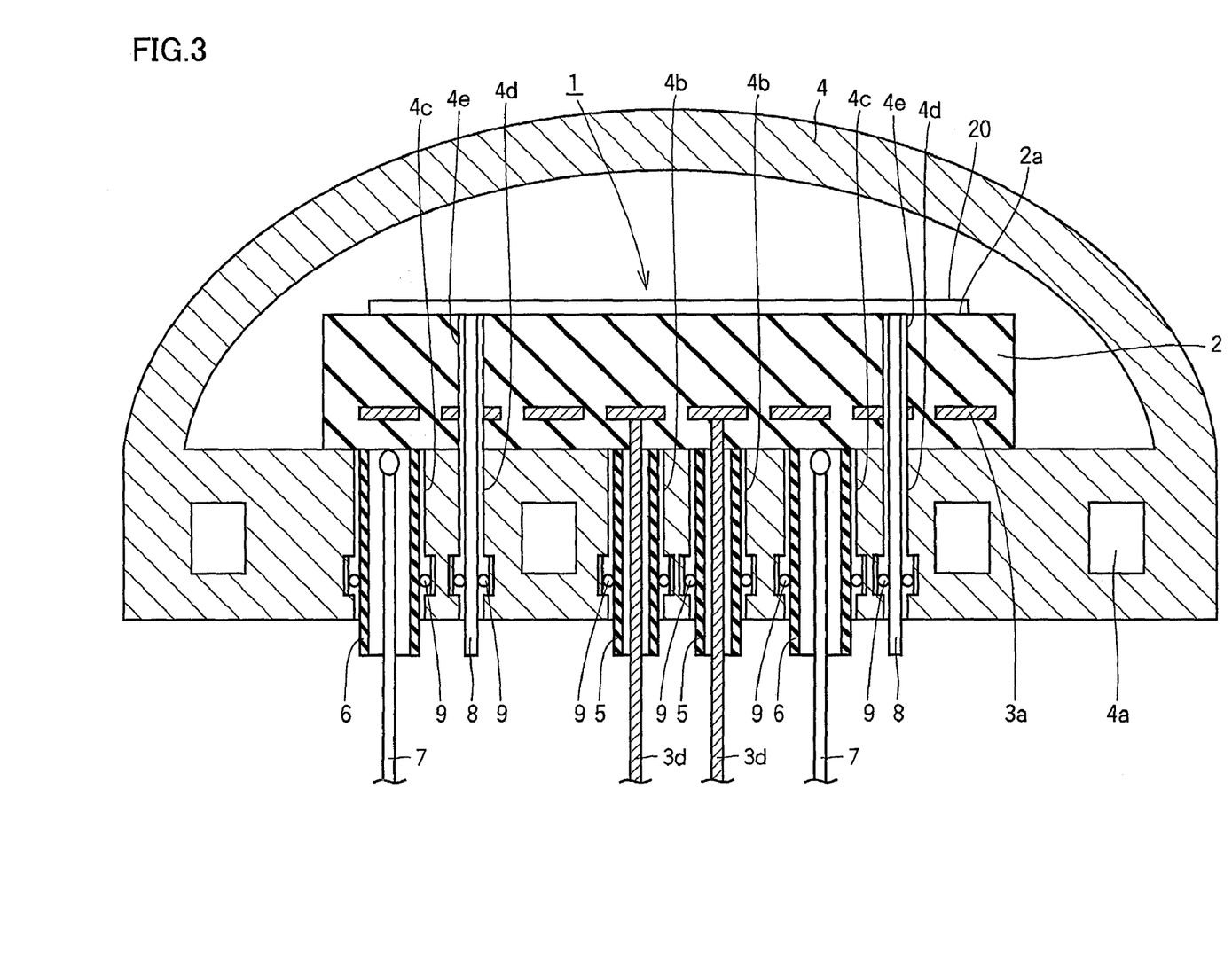
FIG. 3 is a schematic cross section illustrating a thermocouple directly in contact with the ceramic base body.

Though a structure in which coating member 6 is positioned between thermocouple 7 and ceramic base body 2 has been described with reference to FIG. 1, thermocouple 7 may be arranged in direct contact with the surface of ceramic base body 2, as shown in FIG. 3.

Figure 4:
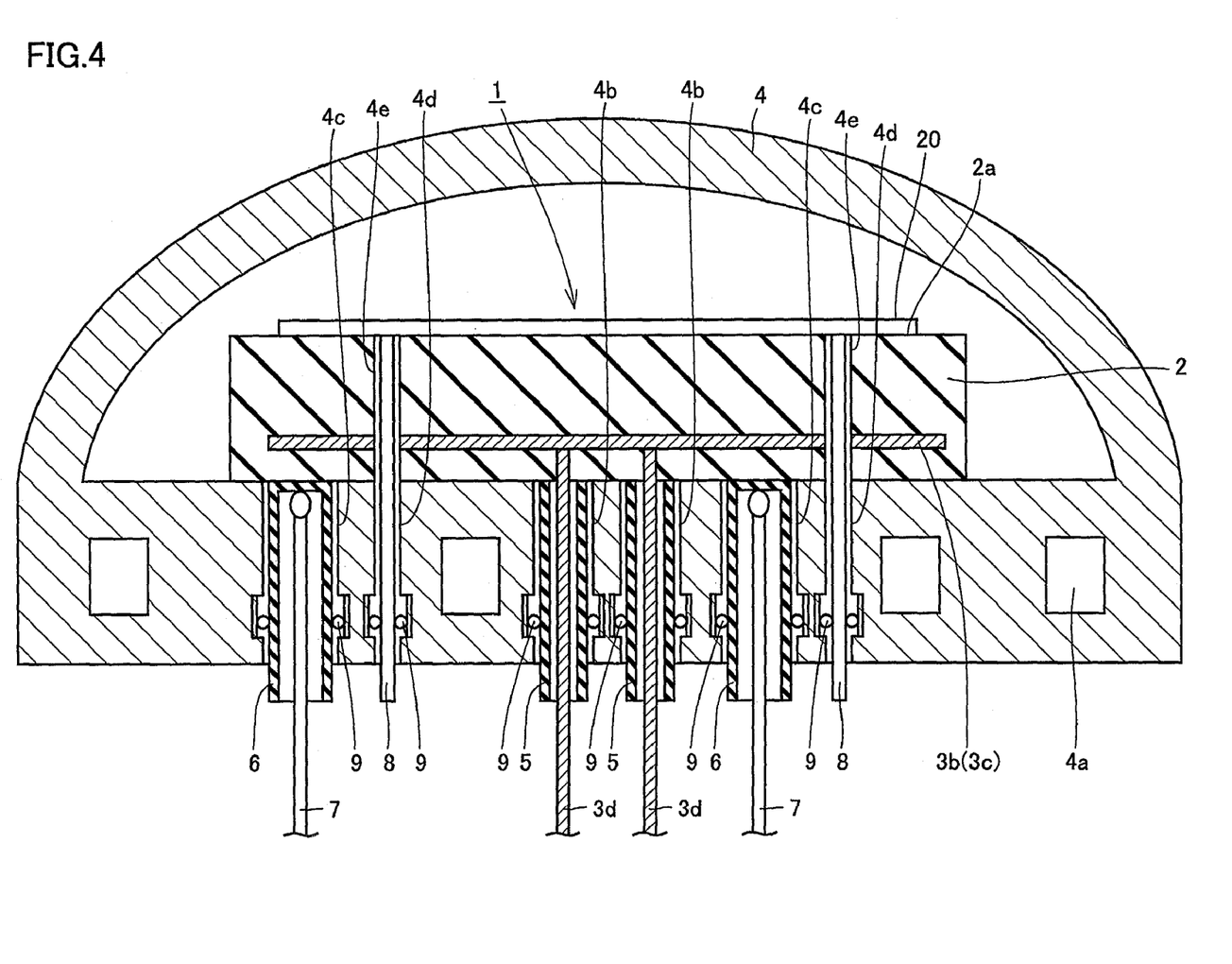
FIG. 4 is a schematic cross section showing a structure when an electrode for electrostatic chuck or an RF electrode is used as the electric circuitry.
Figure 5:
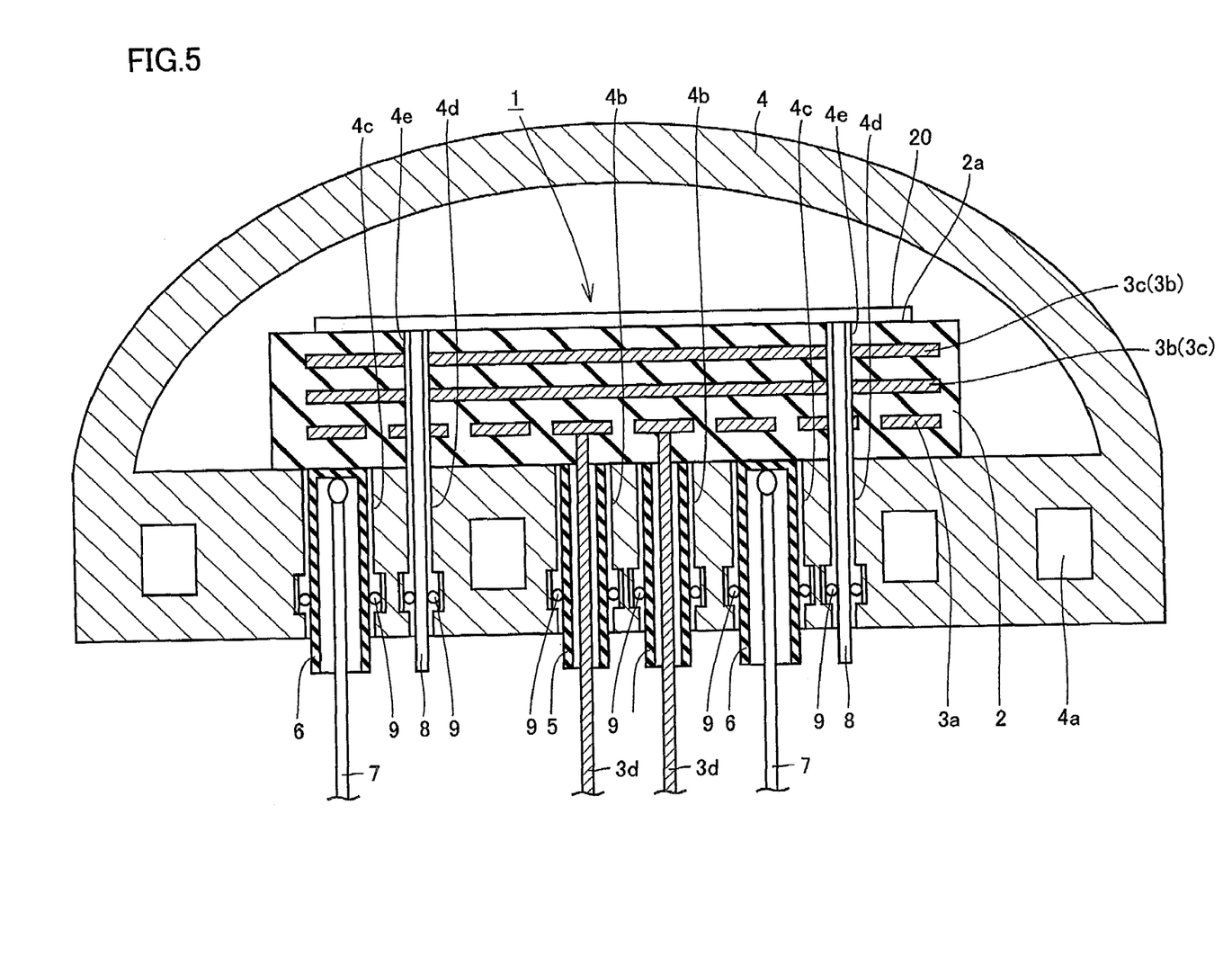
FIG. 5 is a schematic cross section showing a structure when a resistance heater, an electrode for electrostatic chuck and an RF electrode are used combined for the electric circuitry.

Though an example in which resistance heater 3a only is used as the electric circuit has been described with reference to FIG. 1, only an electrode 3b for electrostatic chuck or only an RF electrode 3c may be used as the electric circuitry as shown in FIG. 4. Alternatively, resistance heater 3a, electrode 3b for electrostatic chuck and RF electrode 3c may be arbitrarily combined as shown in FIG. 5. The combination may include the combination of resistance heater 3a and electrode 3b of electrostatic chuck, the combination of resistance heater 3a and RF electrode 3c, the combination of electrode 3b for electrostatic chuck and RF electrode 3c, and the combination of resistance heater 3a, electrode 3b for electrostatic chuck and RF electrode 3c.

Figure 6:
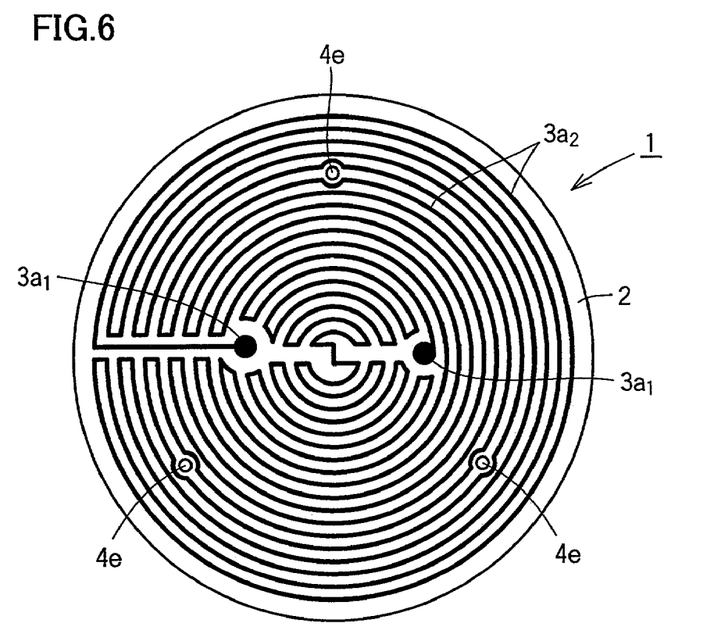
FIG. 6 is a plan view showing a pattern of the resistance heater.

Preferably, planar pattern of resistance heater 3a has a heating portion $3a_2$ having circular patterns and terminal portions $3a_1$ positioned at opposing ends of heating portion $3a_2$, as shown in FIG. 6. Heating portion $3a_2$ is patterned such that it does not interfere with the push pin 8.

Figure 7:
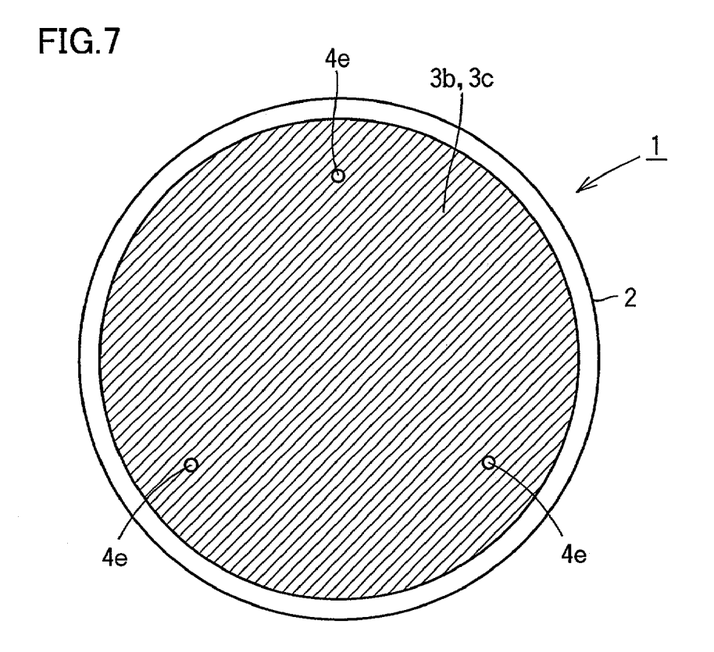
FIG. 7 is a plan view showing a pattern of the electrode for electrostatic chuck or the RF electrode.

Electrode 3b for electrostatic chuck or RF electrode may be formed to such a pattern as shown in FIG. 7. The electrode 3b for electrostatic chuck or RF electrode 3c is also patterned not to interfere with push pin 8.

Though a structure in which both surfaces of resistance heater 3a are sandwiched by ceramic base body 2 has been described in the embodiment above, the surface opposite to the substrate mounting surface 2a of resistance heater 3a may be covered by a protective layer formed of a material other than ceramics.

Examples of the present invention will be described in the following.

EXAMPLE 1 slurry samples were prepared by adding an organic solvent and a binder to ceramic powders of respective compositions as listed in Table 1 below, and mixing in a ball mill. The resulting slurry samples were formed to sheets, by doctor blade method. On the resulting sheets, by resistance heater circuit, an electrode for electrostatic chuck and an RF electrode (for generating plasma) are formed as needed, by screen printing, using tungsten paste. Thereafter, the resulting sheets are stacked, degreased and sintered in a non-oxidizing atmosphere, portions through which push pins are to be inserted are drilled, and ceramic base bodies were thus fabricated.

TABLE 1

| Sample | Main Component | Additive |
|---|---|---|
| 1 | Aluminum nitride | None |
| 2 | Aluminum nitride | $Y_2O_3$ (0.05 mass %) |
| 3 | Aluminum nitride | $Y_2O_3$ (0.5 mass %) |
| 4 | Aluminum nitride | $Y_2O_3$ (1.0 mass %) |
| 5 | Aluminum nitride | $Y_2O_3$ (3.0 mass %) |
| 6 | Aluminum nitride | $Eu_2O_3$ (0.5 mass %) |
| 7 | Aluminum nitride | $Yb_2O_3$ (0.5 mass %) |
| 8 | Silicon carbide | None |
| 9 | Alumina | MgO (0.5 mass %) |
| 10 | Alumina | None |
| 11 | Silicon nitride | $Y_2O_3$ (0.5 mass %) |

Thereafter, at portions of these ceramic base bodies where the power supply conductive member and the temperature measurement sensor (thermocouple) are to be attached, coating members of the same material as the ceramic base bodies are attached. As to the method of attachment, glass mainly containing alumina is used as an adhesive layer. Here, each coating member used has an inner diameter of 2.0 mm and outer diameter of 3.0 mm. Thereafter, the power supply conductive members and thermocouples are attached, and the resulting bodies are mounted in a chamber. Here, the chamber has a recessed portion of which inner diameter is slightly larger than each ceramic base body, at the placing portion, and therefore, the ceramic base body can be placed stationary. Thereafter, the ceramic base body is attached to the chamber contact surface, the powder supply conductive member and the thermocouple are placed in a coating member, the push pin is placed at a prescribed position, and these are air-tightly sealed on the chamber side, by O-rings, respectively.

Thereafter, a silicon wafer or a glass substrate for liquid crystal is mounted on the substrate mounting surface of each ceramic body. The chamber is evacuated, power is supplied through the power supply conductive member to the resistance heater, the electrode for electrostatic chuck and/or RF electrode formed on the ceramic base body is energized, and reaction gas is introduced to the chamber as needed. Each process is performed at 550° C. As a result, prescribed processings can be carried out on the silicon wafer and the substrate for liquid crystal. Namely, it is found that the resistance heater, the electrode for electrostatic chuck and the in electrode all operate satisfactorily in the present structure, which is a simplified structure. Thermal uniformity of the ceramic base bodies at 550° C. is as shown in Table 2 below.

TABLE 2

| Sample | Main component | Additive | Thermal Conductivity | Thermal Uniformity at 550° C. |
|---|---|---|---|---|
| 1 | AlN | None | 85 | ±5.8 |
| 2 | AlN | $Y_2O_3$ (0.05 mass %) | 156 | ±2.7 |
| 3 | AlN | $Y_2O_3$ (0.5 mass %) | 192 | ±2.3 |
| 4 | AlN | $Y_2O_3$ (1.0 mass %) | 190 | ±2.3 |
| 5 | AlN | $Y_2O_3$ (3.0 mass %) | 187 | ±2.3 |
| 6 | AlN | $Eu_2O_3$ (0.5 mass %) | 188 | ±2.3 |
| 7 | AlN | $Yb_2O_3$ (0.5 mass %) | 185 | ±2.4 |
| 8 | SiC | None | 173 | ±2.5 |
| 9 | $Al_2O_3$ | MgO (0.5 mass %) | 23 | ±9.2 |
| 10 | $Al_2O_3$ | None | 21 | ±9.0 |
| 11 | $Si_3O_4$ | $Y_2O_3$ (0.5 mass %) | 35 | ±7.3 |

EXAMPLE 2

Thereafter, ceramic base bodies used in Example 1 were heated to 750° C. in vacuum. The temperatures near the O-rings were measured, and the temperature was 132° C. in sample 3. The O-ring used here has a heat resistance up to 150° C., and therefore there was no leakage in the chamber. Here, the thermal uniformity of the substrate mounting surface was ±3.6° C.

Further, a cooling water is caused to flow to the chamber, so as to cool the chamber. As a result, the temperature near the O-rings was decreased to 38° C. Thermal uniformity of the substrate mounting surface was ±3.7° C.

Then, indium as a soft metal was filled, on the outer side of O-ring with respect to the chamber, between the chamber and the coating member. As a result, the temperature near the O-ring was decreased to 22° C. Thermal uniformity of the substrate mounting surface was ±3.7° C.

EXAMPLE 3

Samples corresponding to Sample 3 used in Example 2, which have surface roughness of Ra=0.7, 0.2 and 0.07 μm, respectively, on the side opposite to the substrate mounting surface were prepared. Further, chambers having ceramic base body placing surfaces with a surface roughness of Ra=0.8, 0.2 and 0.05 μm, respectively, were prepared. Thereafter, respective ceramic base bodies were placed in the chambers, heated to 750° C., and the temperature of the O-ring was measured. The result is as shown in Table 3.

TABLE 3

O-ring Temperature

|  |  | Surface Roughness of Ceramic Base Body (Ra:μm) | | |
|---|---|---|---|---|
|  |  | 0.7 | 0.2 | 0.07 |
| Surface Roughness of Chamber (Ra:μm) | 0.8 | 132° C. | 80° C. | 72° C. |
|  | 0.2 | 38° C. | 32° C. | 31° C. |
|  | 0.05 | 35° C. | 30° C. | 28° C. |

Thermal uniformity of the substrate mounting surface was, in each case, ±3.7° C. Output of the ceramic base bodies (power lead to ceramic base body) was also measured, which was as shown in Table 4.

TABLE 4

| Surface Roughness of Chamber (Ra: μm) | Surface Roughness of Ceramic Base Body (Ra: μm) | | |
|---|---|---|---|
|  | 0.7 | 0.2 | 0.07 |
| 0.8 | 1230 W | 928 W | 855 W |
| 0.2 | 652 W | 619 W | 608 W |
| 0.05 | 631 W | 605 W | 594 W |

EXAMPLE 4

Ceramic base bodies similar to those of Example 1 were prepared. The resistance heater formed on each of the ceramic base bodies was divided into a central zone 1 and an outer zone 3, which were adapted to be separately controllable. The thermocouple and the power supply conductive member cowered with coating members of the same material as the ceramic bass body similar to those used in Example 1 were provided, at three portions at the outer portion and one at the central portion of the ceramic base body, the amount of power supply to the resistance heater in each zone was adjusted while monitoring the temperature, and the ceramic bass body was heated to 550° C. Thermal uniformity at that time was as shown in Table 5.

TABLE 5

| Sample | Main component | Additive | Thermal Conductivity | Thermal Uniformity at 550° C. |
|---|---|---|---|---|
| 1 | AlN | None | 85 | ±4.2 |
| 2 | AlN | Y$_2$O$_3$ (0.05 mass %) | 156 | ±2.1 |
| 3 | AlN | Y$_2$O$_3$ (0.5 mass %) | 192 | ±1.8 |
| 4 | AlN | Y$_2$O$_3$ (1.0 mass %) | 190 | ±1.8 |
| 5 | AlN | Y$_2$O$_3$ (3.0 mass %) | 187 | ±1.8 |
| 6 | AlN | Eu$_2$O$_3$ (0.5 mass %) | 188 | ±1.9 |
| 7 | AlN | Yb$_2$O$_3$ (0.5 mass %) | 185 | ±1.9 |
| 8 | SiC | None | 173 | ±2.0 |
| 9 | Al$_2$O$_3$ | MgO (0.5 mass %) | 23 | ±7.3 |
| 10 | Al$_2$O$_3$ | None | 21 | ±7.5 |
| 11 | Si$_3$O$_4$ | Y$_2$O$_3$ (0.5 mass %) | 35 | ±6.1 |

From the foregoing, it could be understood that by increasing the of portions for temperature measurement and by adjusting amount supply to each zone, thermal uniformity could be improved.

EXAMPLE 5

The substrate surface of each of the ceramic sintered bodies used in Example 1 was polished. Practical usability of each sample thus processed was confirmed in the following manner. A diskshaped heater was prepared by embedding tungsten (W) filament in a matrix of separately prepared aluminum nitride ceramic. Thereafter, each sample was mounted on the heater, and placed in a vacuum chamber of a plasma generating apparatus that employs high frequency of 13.56 MHz. Each of the samples was processed for 5 hours in an environment of CF$_4$ gas with a plasma density of 1.4 W/cm$^2$ at a heating temperature of 100° C. Thereafter, the density of etching craters of the plasma irradiated surface was inspected. The density of the etching craters was inspected by using a scanning electron microscope, and a number of craters of which maximum opening diameter is at least 1 μm existing in am arbitrary view field of 1000 μm$^2$ of the surface was counted. The result is as shown in Table 6.

TABLE 6

| Sample | Main component | Additive | Number of Defects |
|---|---|---|---|
| 1 | AlN | None | 17 |
| 2 | AlN | Y$_2$O$_3$ (0.05 mass %) | 10 |
| 3 | AlN | Y$_2$O$_3$ (0.5 mass %) | 5 |
| 4 | AlN | Y$_2$O$_3$ (1.0 mass %) | 5 |
| 5 | AlN | Y$_2$O$_3$ (3.0 mass %) | 14 |
| 6 | AlN | Eu$_2$O$_3$ (0.5 mass %) | 13 |
| 7 | AlN | Yb$_2$O$_3$ (0.5 mass %) | 12 |
| 8 | SiC | None | 19 |
| 9 | Al$_2$O$_3$ | MgO (0.5 mass %) | 23 |
| 10 | Al$_2$O$_3$ | None | 21 |
| 11 | Si$_3$O$_4$ | Y$_2$O$_3$ (0.5 mass %) | 35 |

From the results, it could be understood that when the content of the sintering assistant agent including yttrium was at least 0.05 mass % and at most 1.0 mass %, the number of etching craters was made small.

EXAMPLE 6

Using Sample 3 of Example 1, the ceramic was heated to 750° C. in the atmosphere of 133 Pa, 133×10 Pa, 133×50 Pa and 133×760 Pa in the same apparatus by the same method as in Example 1, and the temperature of the chamber near the O-ring was measured. As a result, the temperature was 132° C. at 133 Pa, 133° C. at 133×10 Pa, 148° C. at 133×50 Pa and 589° C. at 133×760 Pa. Thus, it could be understood that the amount of heat transmission to the chamber caused by convection increased as the inner pressure was increased.

COMPARATIVE EXAMPLE 1

For each of the samples used in Example 1, a cylindrical support portion having an outer diameter of 80 mm, inner diameter of 70 mm and the length of 250 mm formed of the same material as the ceramic was joined by the same method as in Example 1, at the central portion on the surface opposite to the substrate mounting surface. Thereafter, the power supply conductive member and the thermocouple were attached. Then, an end portion on that side which is not joined to the cylindrical support portion was air-tightly sealed with the chamber using an O-ring, and the samples were heated to 550° C. to measure thermal uniformity. The result is as shown Table 7.

TABLE 7

| Sample | Main component | Additive | Thermal Conductivity | Thermal Uniformity at 550° C. |
|---|---|---|---|---|
| 1 | AlN | None | 85 | ±7.3 |
| 2 | AlN | $Y_2O_3$ (0.05 mass %) | 156 | ±5.2 |
| 3 | AlN | $Y_2O_3$ (0.5 mass %) | 192 | ±4.6 |
| 4 | AlN | $Y_2O_3$ (1.0 mass %) | 190 | ±4.6 |
| 5 | AlN | $Y_2O_3$ (3.0 mass %) | 187 | ±4.7 |
| 6 | AlN | $Eu_2O_3$ (0.5 mass %) | 188 | ±4.7 |
| 7 | AlN | $Yb_2O_3$ (0.5 mass %) | 185 | ±4.7 |
| 8 | SiC | None | 173 | ±4.9 |
| 9 | $Al_2O_3$ | MgO (0.5 mass %) | 23 | ±11.5 |
| 10 | $Al_2O_3$ | None | 21 | ±10.8 |
| 11 | $Si_3O_4$ | $Y_2O_3$ (0.5 mass %) | 35 | ±9.3 |

From the result shown in Table 7, it could be understood that thermal uniformity was degraded when the cylindrical support portion was provided.

EXAMPLE 7

The ceramic base bodies used in Example 1 and the ceramic base bodies used in Comparative Example 1 were positioned in a chamber. Here, the height of the chamber was 120 mm for Example 1, and the height was 380 mm for comparative Example 1. Thus, it was understood that by the method of the present invention, characteristics could be improved as represented by the examples described above while the size of the chamber was significantly reduced. Further, as the chamber could be made smaller, the manufacturing apparatus itself could be made smaller.

EXAMPLE 8

Ceramic base bodies similar to those of Example 1 were fabricated. Thereafter, portions of the chamber at which the temperature measurement terminal and the power supply conductive member of the ceramic base body are to be attached ware drilled. Outer circumferential portions of the holes thus formed and the ceramic base body were adhered by an aluminum brazing member. Thereafter, similar processing as in Example 1 was performed, and it was confirmed that prescribed processings could be performed on the silicon wafer and the substrate for liquid crystal at 550° C. in the similar manner as in Example 1. More specifically, it was found that the resistance heater, the electrode for electrostatic chuck and the RF electrode all operated normally in the present structure.

As described above, according to the present invention, the flat plate portion of the substrate susceptor is in contact with the chamber and thus directly supported by the chamber. Thus, a substrate processing apparatus can be obtained in which thermal uniformity can be improved, which cost can be reduced, suitable for reducing the size and in which restrictions in mounting power supply conductive members and the like can be eased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate processing apparatus for processing a substrate, comprising a substrate susceptor arranged in a chamber, wherein:
   said chamber comprises chamber walls that bound an enclosed chamber space in which said substrate susceptor is arranged, said chamber walls comprising a bottom wall formed as a flat planar chamber wall which has a first contact surface area with a surface roughness of Ra≦0.8 μm; and
   said substrate susceptor comprises a flat plate portion consisting essentially of a unitary ceramic base body and an electric circuitry arranged therein;
   said ceramic base body is bounded by surfaces comprising a ceramic back surface and a substrate mounting surface adapted to have the substrate mounted thereon, said ceramic back surface facing opposite said substrate mounting surface and extending parallel to said substrate mounting surface, wherein said ceramic back surface comprises a further contact surface area with a surface roughness of Ra≦0.7 μm;
   and wherein said first and further contact surface areas are in direct contact with each other whereby said substrate susceptor is supported by said chamber;
   said substrate processing apparatus further comprises a cooling apparatus positioned for cooling said chamber with which said flat plate portion is in contact.

2. The substrate processing apparatus according to claim 1, wherein said electric circuitry includes at least one selected from the group consisting of a resistance heater, an electrode for an electrostatic chuck and an RF electrode.

3. The substrate processing apparatus according to claim 1, wherein a small space exists between said flat plate portion and said chamber.

4. The substrate processing apparatus according to claim 1, further comprising
   a power supply conductive member electrically connected to said electric circuitry and extending out of said chamber, and a temperature measurement terminal inserted from the outside to the inside of said chamber for measuring temperature of said ceramic base body; and wherein
   a portion of said chamber at which said power supply conductive member and said temperature measurement terminal pass through a wall of said chamber is air-tightly sealed between said chamber and said conductive member and between said chamber and said terminal.

5. The substrate processing apparatus according to claim 4, wherein said power supply conductive member is covered with a first coating member of the same material as said ceramic base body at least in said chamber.

6. The substrate processing apparatus according to claim 4, wherein said temperature measurement terminal is covered with a second coating member of the same material as said ceramic base body at least in said chamber.

7. The substrate processing apparatus according to claim 1, further comprising
a power supply conductive member electrically connected to said electric circuitry and extending out of said chamber, and a temperature measurement terminal inserted from the outside to the inside of said chamber for measuring temperature of said ceramic base body; wherein
a portion of said chamber where said power supply conductive member and said temperature measurement terminal pass through a wall of said chamber is airtightly sealed by joining said flat plate portion and said chamber.

8. The substrate processing apparatus according to claim 1, wherein said first contact surface area of said flat planar chamber wall is mirror-finished to provide said surface roughness of Ra≦0.8 μm.

9. The substrate processing apparatus according to claim 1, wherein said further contact surface area of said ceramic back surface of said ceramic base body is mirror finished to provide said surface roughness of Ra≦0.7 μm.

10. The substrate processing apparatus according to claim 1, wherein said surface roughness of said first and second contact surface areas is respectively a surface roughness of Ra≦0.2 μm.

11. The substrate processing apparatus according to claim 1, further comprising
a push pin inserted from the outside to the inside of said chamber for pushing up from said substrate mounting surface of said substrate susceptor the substrate mounted on said substrate susceptor; wherein
a portion of said chamber at which said push pin passes through said chamber is air-tightly sealed between said push pin and said chamber.

12. The substrate processing apparatus according to claim 1, adapted to be used under a low pressure of at most 133×10 Pa.

13. The substrate processing apparatus according to claim 1, adapted and equipped to be used for any processes including chemical vapor deposition using plasma, chemical vapor deposition under low pressure, chemical vapor deposition for forming a metal layer, chemical vapor deposition for forming an insulating film, ion implantation and etching.

14. The substrate processing apparatus according to claim 1, wherein said ceramic base body includes at least one component selected from the group consisting of aluminum oxide, aluminum nitride, silicon nitride and silicon carbide.

15. The substrate processing apparatus according to claim 14, wherein material of said ceramic base body is made of aluminum nitride.

16. The substrate processing apparatus according to claim 15, wherein said ceramic base body includes a sintering assistant agent including a rare-earth.

17. The substrate processing apparatus according to claim 16, wherein said rare-earth included in said sintering assistant agent is yttrium, and content of said sintering assistant agent is at least 0.05 mass % and at most 1.0 mass % of said ceramic base body.

18. The substrate processing apparatus according to claim 1, wherein said bottom wall forms a lowermost bounding surface of a lowermost extent of said chamber space.

19. The substrate processing apparatus according to claim 1, wherein said flat planar chamber wall forming said bottom wall is one single integral wall member with a continuous flat planar surface at a bottom of said chamber.

20. The substrate processing apparatus according to claim 1, wherein said cooling apparatus is integrated in or connected to said flat planar chamber wall forming said bottom wall.

21. The substrate processing apparatus according to claim 20, wherein said cooling apparatus comprises coolant passages having a liquid coolant flowing therethrough.

22. The substrate processing apparatus according to claim 1, wherein said surface roughness of said first contact surface area of said flat planar chamber wall is Ra≦0.2 μm.

23. The substrate processing apparatus according to claim 1, wherein said surface roughness of said further contact surface area of said ceramic back surface of said ceramic base body is Ra ≦0.2 μm.

* * * * *

UNITED STATES PATENT AND TRADEMARK OFFICE
CERTIFICATE OF CORRECTION

PATENT NO. : 7,361,230 B2
APPLICATION NO. : 10/119955
DATED : April 22, 2008
INVENTOR(S) : Natsuhara et al.

It is certified that error appears in the above-identified patent and that said Letters Patent is hereby corrected as shown below:

Column 1,
Line 39, after "publication,", replace "beating" by --heating--;

Column 4,
Line 33, after "it", replace "nay" by --may--;

Column 5,
Line 18, after "the", replace "joint.contact" by --joint contact--;
Line 55, after "can", replace "he" by --be--;
Line 57, after "the", replace "fist" by --flat--;
Line 59, after "num,", replace "palledium" by --palladium--;
Line 66, before "form", delete --attain--;

Column 6,
Line 3, after "films", replace "end glees" by --and glass--;

Column 10,
Line 39, after "arranged", delete --of--;
Line 41, after "cooling apparatus,", replace "end" by --and--;

Column 11,
Line 39, before "samples", replace "slurry" by --Slurry--;

Column 12,
Line 13, after "surface, the", replace "powder" by --power--;
Line 29, before "electrode", replace "in" by --RF--;
Line 55, before "3.", replace "sample" by --Sample--;

Column 13,
Line 48, after "member", replace "cowered" by --covered--;
Lines 49 and 54, after "ceramic", replace "bass" by --base--;

Column 14,
Line 13, after "increasing the", insert --number--;
Line 14, after "amount", insert --of power--;
Line 22, after "A", replace "diskshaped" by --disk-shaped--;
Line 34, after "existing in", replace "am" by --an--;

UNITED STATES PATENT AND TRADEMARK OFFICE
CERTIFICATE OF CORRECTION

PATENT NO. : 7,361,230 B2
APPLICATION NO. : 10/119955
DATED : April 22, 2008
INVENTOR(S) : Natsuhara et al.

It is certified that error appears in the above-identified patent and that said Letters Patent is hereby corrected as shown below:

Column 17, claim 9
Line 20, after "body is", replace "mirror finished" by --mirror-finished--.

Signed and Sealed this

Seventh Day of July, 2009

JOHN DOLL
*Acting Director of the United States Patent and Trademark Office*